United States Patent [19]

Koyama

[11] Patent Number: 4,563,594
[45] Date of Patent: Jan. 7, 1986

[54] SCHMITT TRIGGER CIRCUIT USING MOS TRANSISTORS AND HAVING CONSTANT THRESHOLD VOLTAGES

[75] Inventor: Mikio Koyama, Yokohama, Japan

[73] Assignee: Tokyo Shibaura Denki Kabushiki Kaisha, Kawasaki, Japan

[21] Appl. No.: 516,762

[22] Filed: Jul. 25, 1983

[30] Foreign Application Priority Data

Jul. 30, 1982 [JP] Japan ................................ 57-133551

[51] Int. Cl.⁴ ............................................ H03K 3/295
[52] U.S. Cl. .................................... 307/290; 307/443; 307/451; 307/359; 307/279; 307/603
[58] Field of Search ............... 307/443, 451, 359, 579, 307/585, 279, 290, 603, 605

[56] References Cited

U.S. PATENT DOCUMENTS

| | | | |
|---|---|---|---|
| 3,740,580 | 6/1973 | Spies | 307/585 |
| 3,904,888 | 10/1975 | Griffin et al. | 307/279 X |
| 4,295,062 | 10/1981 | Mihalich et al. | 307/290 |
| 4,369,381 | 1/1983 | Okamoto et al. | 307/279 |
| 4,438,352 | 3/1984 | Mardkha | 307/451 X |
| 4,464,587 | 8/1984 | Suzuki et al. | 307/451 X |

FOREIGN PATENT DOCUMENTS 3012618 10/1980 Fed. Rep. of Germany .

OTHER PUBLICATIONS

Patent Abstracts of Japan, Nov. 27, 1979, vol. 3, No. 143.

Primary Examiner—Larry N. Anagnos
Assistant Examiner—D. R. Hudspeth
Attorney, Agent, or Firm—Oblon, Fisher, Spivak, McClelland & Maier

[57] ABSTRACT

An input CMOS inverter comprises a complementary pair of first and second MOS transistors having their gates connected together to receive an input signal, and a buffer circuit connected between drains of the first and second MOS transistors. The buffer circuit is preferably an analog switch circuit having a complementary pair of third and fourth MOS transistors responsive to the input signal and connected in parallel. In response to a potential variation caused at the drain of one of the first and second transistors, the buffer circuit causes a potential variation at the drain of the other transistor after a delay. There is provided a second MOS inverter having a complementary pair of fifth and sixth MOS transistors with their gates connected to the drains of the first and second transistors, respectively. A feedback circuit is connected to the output of the second inverter to suppress the potential variation at the drains of the first and second transistors. The feedback circuit preferably includes a third inverter and a complementary pair of seventh and eighth MOS transistors connected to the drains of the first and second transistors, respectively, and controlled by the third inverter.

17 Claims, 14 Drawing Figures

SCHMITT TRIGGER CIRCUIT USING MOS TRANSISTORS AND HAVING CONSTANT THRESHOLD VOLTAGES

BACKGROUND OF THE INVENTION

This invention relates to a Schmitt trigger circuit (hysteresis circuit) using metal oxide semiconductor field effect transistors (MOSFETs).

Various types of Schmitt trigger circuits using MOSFETs are known. FIGS. 1 and 2 show typical examples of prior art Schmitt trigger circuits using complementary MOSFETs.

The prior art circuit shown in FIG. 1 is disclosed in an early published Japanese Patent Specification No. 54-121051, laid open on Sept. 19, 1979. This circuit comprises an input CMOS inverter 11 consisting of p-type transistors $P_1$ and $P_2$ and n-type transistors $N_1$ and $N_2$; a CMOS inverter 12 consisting of complementary transistors $P_4$ and $N_4$ connected to the output of the inverter 11; and additional transistors $P_3$ and $N_3$ which are connected respectively in parallel to the complementary transistors $P_1$ and $N_1$ and which are controlled by the inverter 12.

When an input voltage $V_{in}$ rises from zero volts and when it drops from $V_{DD}$ volts, the corresponding resistance ratios of the input CMOS inverter 11 are varied by the additional transistors $P_3$ and $N_3$ in response to an output voltage $V_{out}$ of the CMOS inverter 12, thereby realizing the hysteresis characteristic.

The operation of the circuit of FIG. 1 will now be described. It is assumed that threshold voltages of p-FETs and n-FETs are respectively $V_{TP}$ and $V_{TN}$, ON resistances of p-FETs $P_1$, $P_2$ and $P_3$ are respectively $R_{P1}$, $R_{P2}$ and $R_{P3}$, and ON resistances of n-FETs $N_1$, $N_2$ and $N_3$ are respectively $R_{N1}$, $R_{N2}$ and $R_{N3}$.

When an input signal $V_{in}$ is at $V_{DD}$ volts (e.g. 5 volts), p-FETs $P_1$ and $P_2$ in the inverter 11 are nonconducting, while n-FETs $N_1$ and $N_2$ are conducting. Therefore, the output voltage $V_A$ of the inverter 11 is zero volts and the output voltage $V_{out}$ of the inverter 12 is $V_{DD}$ volts. Thus, FETs $P_3$ and $N_3$ are non-conducting and conducting, respectively.

When the input voltage $V_{in}$ drops from $V_{DD} - |V_{TP}|$, p-FETs $P_1$ and $P_2$ are turned on, so that the output voltage $V_A$ of the inverter 11 will be $$V_A = \frac{R_{N2} + \frac{R_{N1} \cdot R_{N3}}{R_{N1} + R_{N3}}}{R_{P1} + R_{P2} + R_{N2} + \frac{R_{N1} \cdot R_{N3}}{R_{N1} + R_{N3}}} \times V_{DD}$$

The output voltage $V_{out}$ is kept to $V_{DD}$ until $V_A$ reaches the threshold voltage $V_F$ of the inverter 12.

The ON resistance of each FET varies with the input voltage $V_{in}$, and when $V_A$ exceeds $V_F$, the output voltage $V_{out}$ of the inverter 12 is inverted from $V_{DD}$ to zero volts. The input voltage to invert the output voltage $V_{out}$ from $V_{DD}$ to zero volts is a lower threshold voltage $V_{thL}$ of the hysteresis circuit. When the input voltage $V_{in}$ is zero volts, p-FETs $P_1$ and $P_2$ are conducting, while n-FETs $N_1$ and $N_2$ are nonconducting. Thus, $V_A$ is $V_{DD}$ volts and $V_{out}$ is zero volts. At this time, p-FETs $P_3$ and n-FET $N_3$ are conducting and nonconducting, respectively.

In a case where the input voltage $V_{in}$ rises from zero volts, when $V_{in}$ exceeds the threshold voltage $V_{TN}$ of n-FETs $N_1$ and $N_2$, FETs $N_1$ and $N_2$ will turn on. At this time, $V_A$ is given by $$V_A = \frac{R_{N1} + R_{N2}}{\frac{R_{P1} \cdot R_{P3}}{R_{P1} + R_{P3}} + R_{P2} + R_{N1} + R_{N2}} \times V_{DD}$$

$V_A$ drops with an increase in $V_{in}$ and when it falls below $V_F$, the inverter 12 inverts the output voltage $V_{out}$ from zero volts to $V_{DD}$ volts. The input voltage to invert the output voltage $V_{out}$ from zero volts to $V_{DD}$ volts is a higher threshold voltage $V_{thH}$ of the hysteresis circuit. Suitable selection of the channel width and channel length of each of the MOS transistors which constitute the inverter 11, namely, the proper selection of the mutual conductance $g_m$ of each MOS transistor enables a modification of the hysteresis characteristic (threshold voltages and hysteresis width) of the hysteresis circuit.

With such a prior art hysteresis circuit, low-voltage and high-speed operation of the circuit are difficult since the CMOS inverter 11 at the input stage includes a series connection of four FETs $P_1$, $P_2$, $N_1$ and $N_2$ across the power supply. In addition, the threshold voltages of the circuit depend upon the ON resistances of FETs $P_1$, $P_2$, $N_1$ and $N_2$ when a current flows through the CMOS inverter 11 from the $V_{DD}$ terminal to the ground terminal. Therefore, the threshold voltages of the circuit are easily subject to change due to variations in the production processes.

FIG. 2 shows a Schmitt trigger circuit which is disclosed in an early published Japanese Patent Specification No. 57-67319, laid open Apr. 23, 1982.

For ease of explanation, in this circuit, the same elements as those shown in the circuit of FIG. 1 are designated by the same reference numerals. In this circuit, p-FET $P_3$ is connected between a connection point 14 of p-FETs $P_1$ and $P_2$ and ground. On the other hand, n-FET $N_3$ is connected between the $V_{DD}$ terminal and a connection point 15 of n-FETs $N_1$ and $N_2$. A CMOS inverter 13 is connected to the CMOS inverter 12, and complementary FETs $P_3$ and $N_3$ are controlled by the inverter 13.

In the operation of this circuit, when $V_{in} = 0$, p-FETs $P_1$ and $P_2$ are conducting and n-FETs $N_1$ and $N_2$ are nonconducting. Thus, $V_{out}$ is $V_{DD}$ and FETs $P_3$ and $N_3$ are nonconducting and conducting, respectively. Therefore, the circuit point 15 is raised to $V_{DD} - V_{TN}$. When $V_{in}$ rises from zero volts and exceeds $V_{TN}$, n-FETs $N_1$ and $N_2$ conduct. At this time, the circuit point 15 is at $V_{DD} - V_{TN}$, so that the output voltage $V_A$ of the inverter 11 keeps $V_{DD}$. Hence, the inverters 12 and 13 do not invert the output voltage $V_{out}$.

When $V_{in}$ further increases and reaches, for example, 4 volts, the ON resistance of FET $N_1$ becomes minimal and the voltage at the circuit point 15 is substantially at the ground level so that $V_A$ also approaches the ground level. Therefore, the inverters 12 and 13 invert $V_{out}$ from $V_{DD}$ to zero volts.

When $V_{in} = V_{DD}$, $V_{out}$ is zero volts, so that FET $P_3$ is conducting. The voltage at the circuit point 14 is therefore lowered to $|V_{TP}|$. Next, when $V_{in}$ drops from $V_{DD}$ and reaches $V_{DD} - |V_{TP}|$, p-FETs $P_1$ and $P_2$ are turned on. However, since the circuit point 14 is at $|V_{TP}|$ due to conducting FET $P_3$, $V_A$ is kept to zero volts. Therefore, the inverters 12 and 13 do not invert $V_{out}$. When $V_{in}$ further drops and reaches, for example, 1 volt, the ON resistance of p-FET $P_1$ becomes minimal, so that $V_A$ increases to $V_{DD}$. Hence, the inverters 12 and 13 invert $V_{out}$ from zero volts to $V_{DD}$ volts.

With a Schmitt trigger circuit as shown in FIG. 2, low-voltage operation and high-speed operation are difficult like the circuit shown in FIG. 1 since a series connection of four FETs is used. However, one of the threshold voltages of the circuit depends upon the ratio of the ON resistances of p-FETs $P_1$ and $P_3$, and the other threshold voltage depends upon the ratio of the ON resistances of n-FETs $N_1$ and $N_2$, namely upon the ratio of the ON resistances of FETs of the same channel type; therefore, the change of threshold voltages of the circuit due to variations in the production processes is less than the circuit shown in FIG. 1.

SUMMARY OF THE INVENTION

An object of the present invention is to provide a Schmitt trigger circuit which uses fewer transistors connected in series than the conventional circuits, thereby enabling both low-voltage operation and high-speed operation.

Another object of the invention is to provide a Schmitt trigger circuit in which the change of threshold voltages due to variations in the production processes is suppressed.

According to the present invention, a MOS inverter at the input stage includes a complementary pair of first and second MOS transistors having their gates connected together to receive an input signal; and a buffer circuit connected between the drains of the first and second MOS transistors which causes, in response to a potential variation at the drain of one of the first and second transistors, a potential variation at the drain of the other transistor after a delay. Furthermore, there are provided a second MOS inverter responsive to the input-stage MOS inverter, and a feedback circuit responsive to the second MOS inverter to suppress the potential variation at the drain of at least one of the first and second transistors.

Preferably, the buffer circuit includes a complementary pair of MOS transistors connected in parallel, and the second MOS inverter includes a complementary pair of MOS transistors having their gates connected to the drains of the first and second MOS transistors, respectively.

DETAILED DESCRIPTION OF THE PREFERRED EMBODIMENTS

Figure 3:
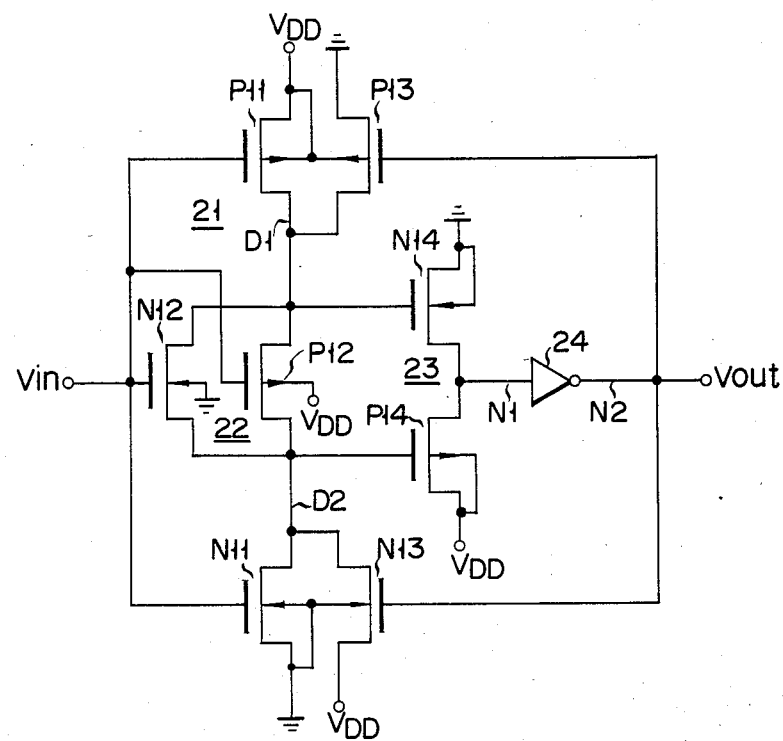
FIG. 3 shows a Schmitt trigger circuit using MOS transistors embodying the present invention.

Referring to FIG. 3, a Schmitt trigger circuit (hysteresis circuit) embodying the present invention comprises a CMOS inverter 21 having complementary FETs $P_{11}$ and $N_{11}$ with their gates connected together to receive an input signal $V_{in}$. The sources of FETs $P_{11}$ and $N_{11}$ are connected to the $V_{DD}$ terminal and ground, respectively. In this embodiment, an analog switching circuit 22 having complementary FETs $P_{12}$ and $N_{12}$ connected in parallel is connected between drains $D_1$ and $D_2$ of FETs $P_{11}$ and $N_{11}$ which are to be connected together in the normal CMOS inverter. FETs $P_{12}$ and $N_{12}$ have also their gates connected together to receive the input signal voltage $V_{in}$. This analog switching circuit 22 functions as a buffer circuit to transmit a potential variation at the drain of one of FETs $P_{11}$ and $N_{11}$ to the drain of other FET with a delay and vice versa. Complementary FETs $P_{14}$ and $N_{14}$ constitute a second CMOS inverter 23, wherein FET $N_{14}$ is connected at its gate to the drain $D_1$ of FET $P_{11}$ and FET $P_{14}$ is connected at its gate to the drain $D_2$ of FET $N_{11}$. The drains of FETs $P_{14}$ and $N_{14}$ are connected together and the sources thereof are connected to the $V_{DD}$ terminal and ground, respectively. p-FET $P_{13}$ is connected between the drain $D_1$ of p-FET $P_{11}$ and ground, and n-FET $N_{13}$ is connected between the drain $D_2$ of n-FET $N_{11}$ and the $V_{DD}$ terminal.

A third MOS inverter 24, which is preferably a CMOS inverter but it is not limited to this, is connected to the output of the CMOS inverter 23. FETs $P_{13}$ and $N_{13}$ are connected to receive the output voltage $V_{out}$ of the MOS inverter 24 at their gates, this output voltage $V_{out}$ being used as an output voltage of the Schmitt trigger circuit. Thus, FETs $P_{13}$ and $N_{13}$ act to prevent the potential variation at the drain of FET $P_{11}$ or $N_{11}$ when FET $P_{11}$ or $N_{11}$ changes from the OFF-state to the ON-state. The MOS inverter 24 and FETs $P_{13}$ and $N_{13}$ constitute a feedback circuit to control the output change of the CMOS inverter 21. In the circuit of FIG. 3, the substrates of the p-FETs are connected to $V_{DD}$ (e.g., 5 volts), and the substrate of the n-FETs are connected to ground (0 volts).

The operation of the circuit shown in FIG. 3 will now be described. It is now to be assumed that all FETs used are of the enhancement type, having a threshold voltage of one volt in absolute value, and that $g_m$ of each FET is designed such that the threshold voltages of the circuit become four volts ($V_{thH}$) and one volt ($V_{thL}$).

When $V_{in}=0$, p-FETs $P_{11}$ and $P_{12}$ are conducting, while n-FETs $N_{11}$ and $N_{12}$ are nonconducting. Thus, the drains $D_1$ and $D_2$ of FETs $P_{11}$ and $N_{11}$ are at substantially $V_{DD}$ volts. Therefore, FETs $N_{14}$ and $P_{14}$ in the CMOS inverter 23 are conducting and nonconducting, respectively, so that the output node $N_1$ is at 0 volts and the output node $N_2$ is at $V_{DD}$ volts. Thus, FET $N_{13}$ is conducting and FET $P_{13}$ is cut off. Although FET $N_{13}$ is on, since the drain $D_2$ of FET $N_{11}$ is at $V_{DD}$ volts, no current flows through FET $N_{13}$. When $V_{in}$ increases and reaches, for example, 2.5 volts, n-FETs $N_{11}$ and $N_{12}$ conduct. Hence, the potential at the drain $D_2$ of n-FET $N_{11}$ is about to fall. However, since the drain $D_2$ is pulled to $V_{DD}$ through FET $N_{13}$ which is on, the fall of potential at the drain $D_2$ is suppressed. On the other hand, the drain $D_1$ of p-FET $P_{11}$ is connected to the drain $D_2$ of FET $N_{11}$ through the ON resistance of n-FET $N_{12}$, so that the potential fall at the drain $D_1$ is further suppressed than at the drain $D_2$. As a result of the suppression of the potential fall at the drains $D_1$ and $D_2$, the CMOS inverter 23 doesn't change its state. That is, $V_{out}$ remains at $V_{DD}$ volts.

When the input voltage $V_{in}$ further increases and exceeds 4 volts, the ON resistance of n-FET $N_{11}$ becomes fairly small, causing the drain $D_2$ to fall close to 0 volts. The drain $D_1$ also falls close to 0 volts after a delay behind the drain $D_2$. Consequently, the CMOS inverter 23 inverts its state to cause the output node $N_1$ to go to $V_{DD}$ volts and the output node $N_2$ to go to zero volts. Thus, FET $P_{13}$ is turned on and FET $N_{13}$ is turned off. Both the source and drain of FET $P_{13}$ are at zero volts, so that no current flows between the source and drain thereof.

In a case where $V_{in}$ falls from $V_{DD}$ volts to 2.5 volts, p-FETs $P_{11}$ and $P_{12}$ conduct. At this time, since p-FET $P_{13}$ is on, the potential rise at the drain $D_1$ of p-FET $P_{11}$ is suppressed, and the potential rise at the drain $D_2$ of n-FET $N_{11}$ is delayed behind the drain $D_1$ due to the On resistance of p-FET $P_{12}$. Therefore, when $V_{in}=2.5$ volts, the CMOS inverter 23 doesn't change its state, so that the node $N_2$ remains at zero volts. When $V_{in}$ falls to one volt, the ON resistance of FET $P_{11}$ becomes fairly small and the potential at the drain $D_1$ becomes close to $V_{DD}$. The potential at the drain $D_2$ also approaches $V_{DD}$ along with the drain $D_1$, so that the CMOS inverter 23 changes its state to cause the node $N_2$ to go to $V_{DD}$.

Figure 4:
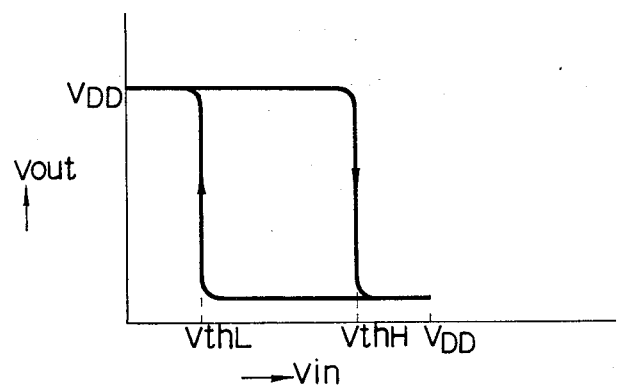
FIG. 4 shows the hysteresis characteristic of the circuit of FIG. 3.

FIG. 4 shows the input/output characteristic of the Schmitt trigger circuit of FIG. 3 which operates in a manner such as was described above. This circuit has a higher threshold voltage $V_{thH}$ and a lower threshold voltage $V_{thL}$ than a threshold voltage of an ordinary CMOS inverter.

Figure 1:
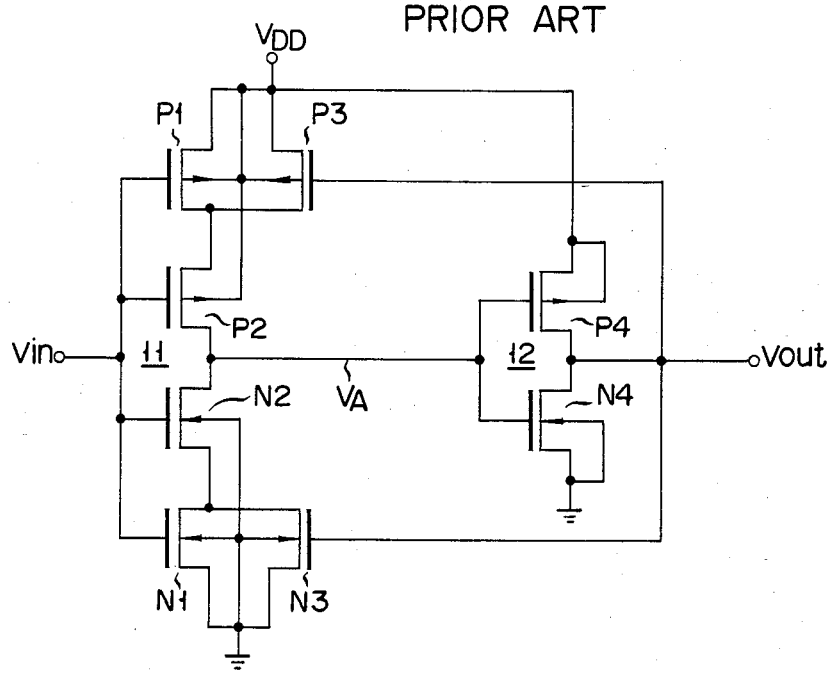
FIGS. 1 and 2 show prior art Schmitt trigger circuits using MOS transistors.
Figure 2:
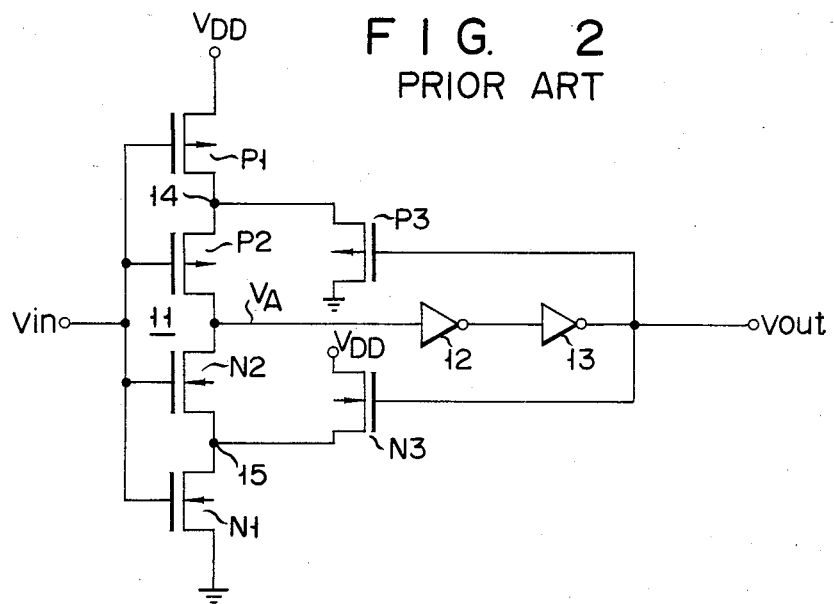

The circuit of the present invention also has fewer FETs to be connected in series across the power supply than the conventional circuits. Therefore, the circuit of the invention can operate from a lower power supply voltage than the conventional circuits, with the result that high-speed operation can be attained. Furthermore, the gates of FETs $N_{14}$ and $P_{14}$ of CMOS inverter 23 are individually connected to the drains $D_1$ and $D_2$ of FETs $P_{11}$ and $N_{11}$; consequently, the load capacitance of the drains $D_1$ and $D_2$ are reduced to half of those in the prior art Schmitt trigger circuits of FIGS. 1 and 2, thereby providing a further advantage for high-speed operation.

According to the circuit of the present invention, the threshold voltages $V_{thL}$ and $V_{thH}$ depend upon the ratio of the ON resistances of p-FETs $P_{11}$ and $P_{13}$ and the ratio of the ON resistances of n-FETs $N_{11}$ and $N_{13}$; in other words, they depend upon the dimensional ratio of p-FETs and the dimensional ratio of n-FETs. Therefore, the threshold voltage $V_{thL}$ and $V_{thH}$ of the circuit hardly change even if the threshold voltage of each FET varies due to variations in the manufacturing process. In the case of prior art circuits of FIGS. 1 and 2, if the threshold voltage of an FET varies, for example, in the positive direction, $V_{thL}$ and $V_{thH}$ will also vary in the positive direction. On the other hand, in the circuit of the present invention, since the drain $D_1$ of p-FET $P_{11}$ is connected to the gate of n-FET $N_{14}$, and the drain $D_2$ of n-FET $N_{11}$ is connected to the gate of p-FET $P_{14}$, the variations of threshold voltages of FETs are cancelled out. Therefore, the influence of the variations of threshold voltages of FETs on the threshold voltages $V_{thL}$ and $V_{thH}$ of the circuit is reduced.

The Schmitt trigger circuit of the present invention is not limited to the embodiment shown in FIG. 3, but various modifications can be made. FIGS. 5 to 14 show examples of such modifications of the circuit of FIG. 3. In these examples, the same elements as those shown in FIG. 3 are designated by the same reference numerals.

Figure 5:
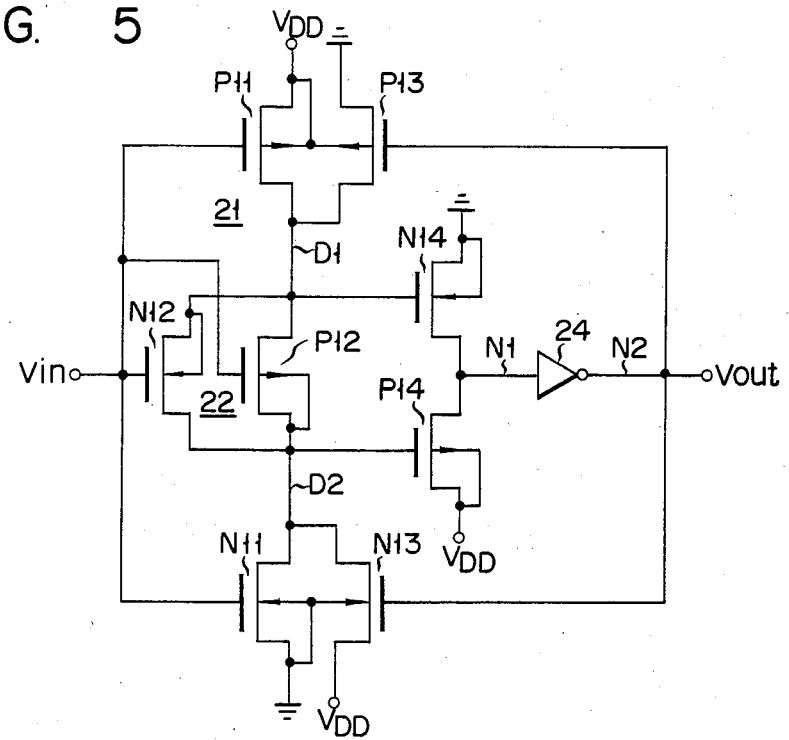
FIGS. 5 to 14 show other embodiments of the present invention.

With reference to the circuit of FIG. 5, in the buffer circuit 22, the substrate of n-FET $N_{12}$ is connected to the drain $D_1$ of p-FET $P_{11}$, and the substrate of p-FET $P_{12}$ is connected to the drain $D_2$ of n-FET $N_{11}$. The operation of the circuit of FIG. 5 is the same as the operation of the circuit of FIG. 3.

Figure 6:
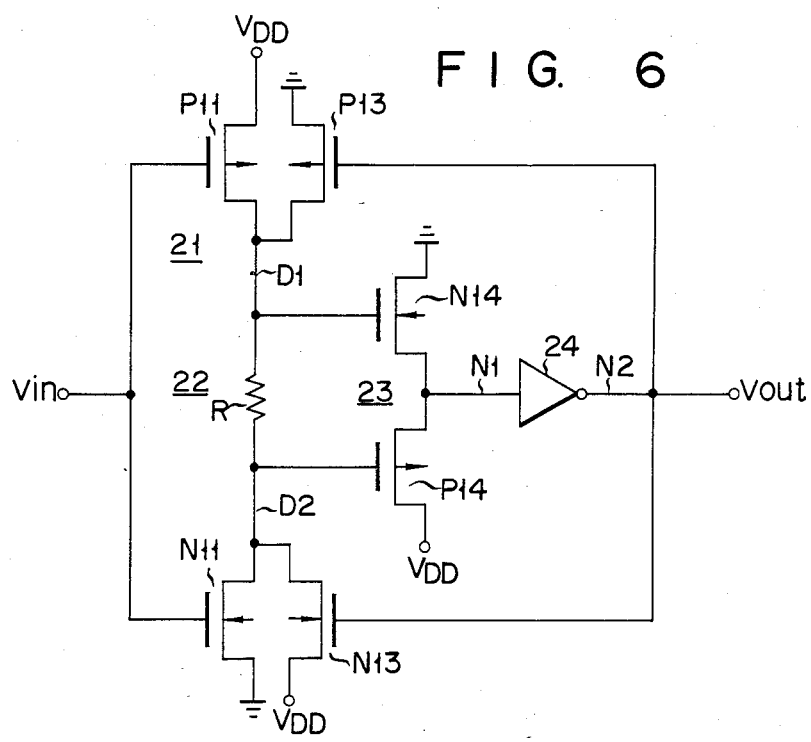
Figure 7:
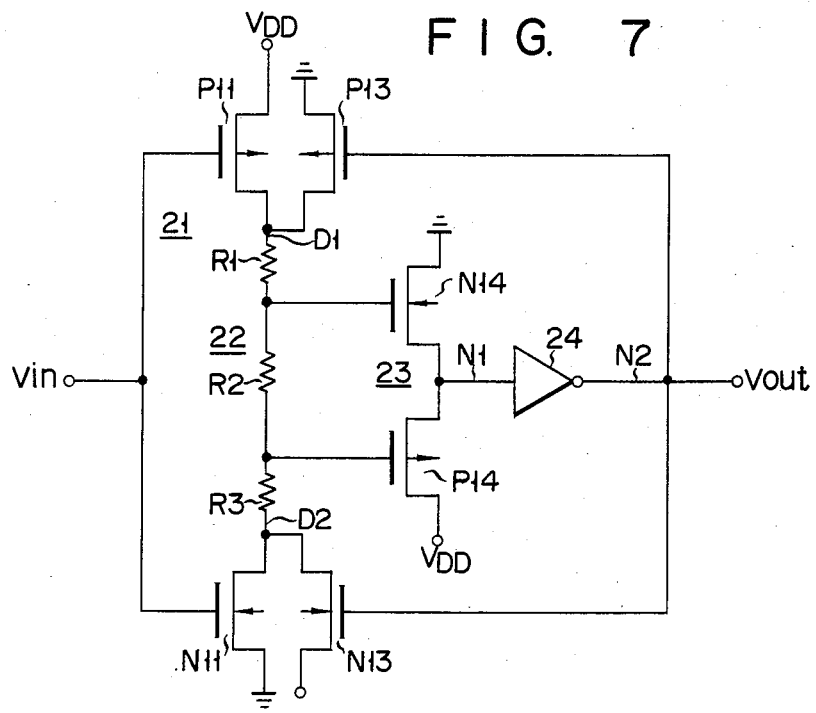
Figure 8:
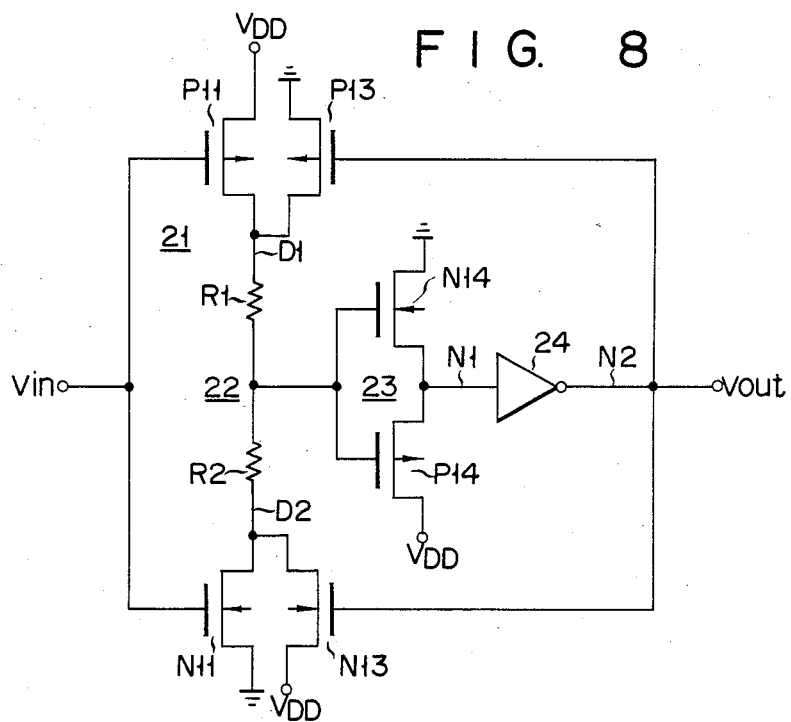

The buffer circuit 22 is provided to prevent a coincidence of the potential variations at the drains $D_1$ and $D_2$ of FETs $P_{11}$ and $N_{11}$ of the input CMOS inverter 21. Therefore, as shown in FIG. 6, a resistor R having a value of, for instance, 10 kiloohms may be used in place of analog switches $P_{12}$ and $N_{12}$ to accomplish a function similar to that of the circuit of FIG. 5. However, with such a resistor, the Schmitt trigger circuit will occupy a large area in an integrated circuit than would the circuit using analog switches as shown in FIG. 3. The resistor R may be divided into three resistors $R_1$, $R_2$ and $R_3$ as shown in FIG. 7. As shown in FIG. 8, the resistor R may also be divided into two resistors $R_1$ and $R_2$ with the connection point thereof connected to the CMOS inverter 23. In this example, since FETs $P_{14}$ and $N_{14}$ which constitute the CMOS inverter 23 have their gates connected together to the connection point of resistors $R_1$ and $R_2$, an inverter using only p-FETs or n-FETs may be used in place of the CMOS inverter 23.

Figure 9:
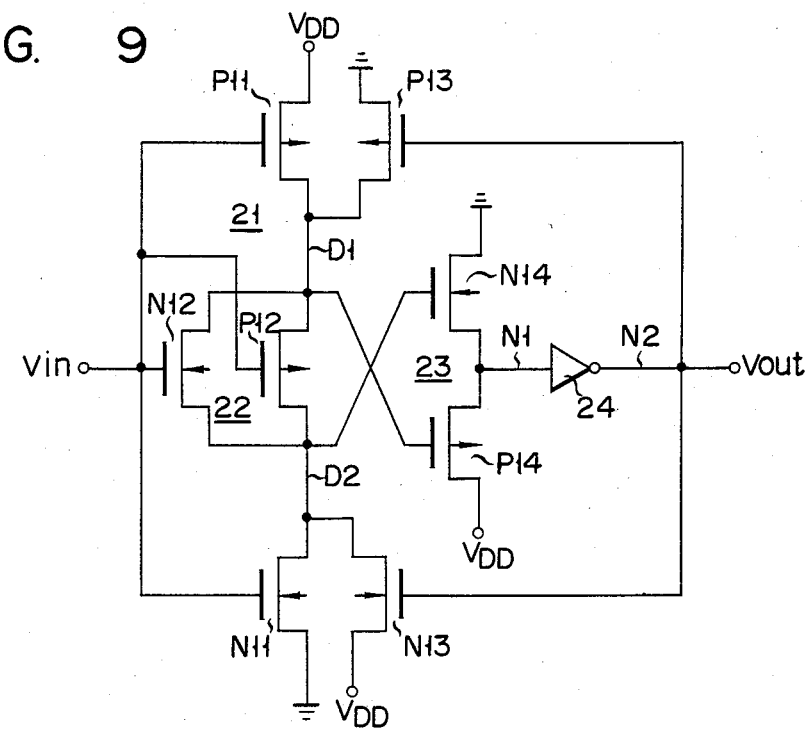

In the circuit of FIG. 9, the drains $D_1$ and $D_2$ of complementary FETs $P_{11}$ and $N_{11}$ of the CMOS inverter 21 are respectively connected to the gates of complementary FETs $P_{14}$ and $N_{14}$ of the CMOS inverter 23. Unlike the circuit of FIG. 3, in the circuit of FIG. 9 it is impossible to obtain the advantageous effect that the variations of the threshold voltages of complementary FETs are cancelled out. However, the low-voltage operation and high-speed operation can be achieved.

Figure 10:
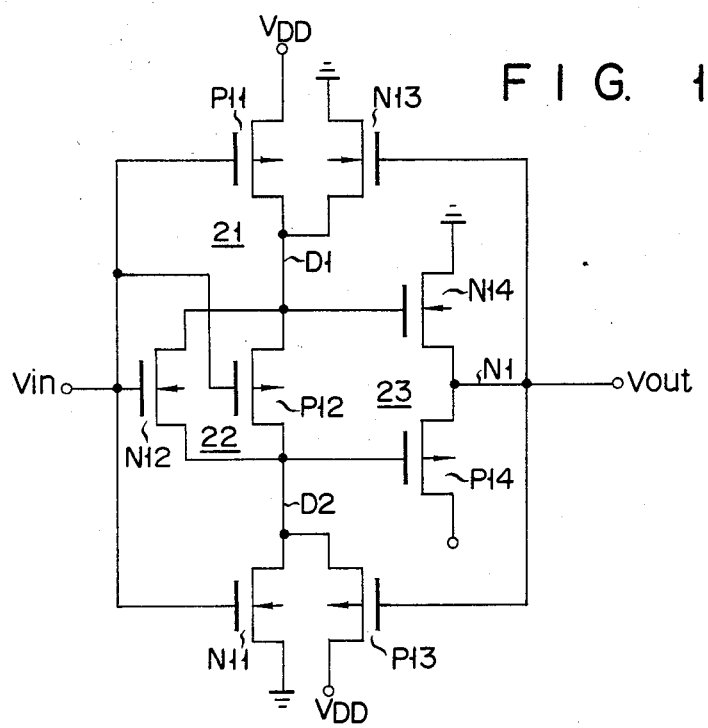

In the circuit of FIG. 10, the third inverter 24, which is used in the circuits described above, is omitted and complementary FETs $P_{13}$ and $N_{13}$ are mutually exchanged. According to this circuit, the threshold voltages will be influenced due to variations of the manufacturing process; however, the low-voltage operation and high-speed operation can be advantageously performed.

Figure 11:
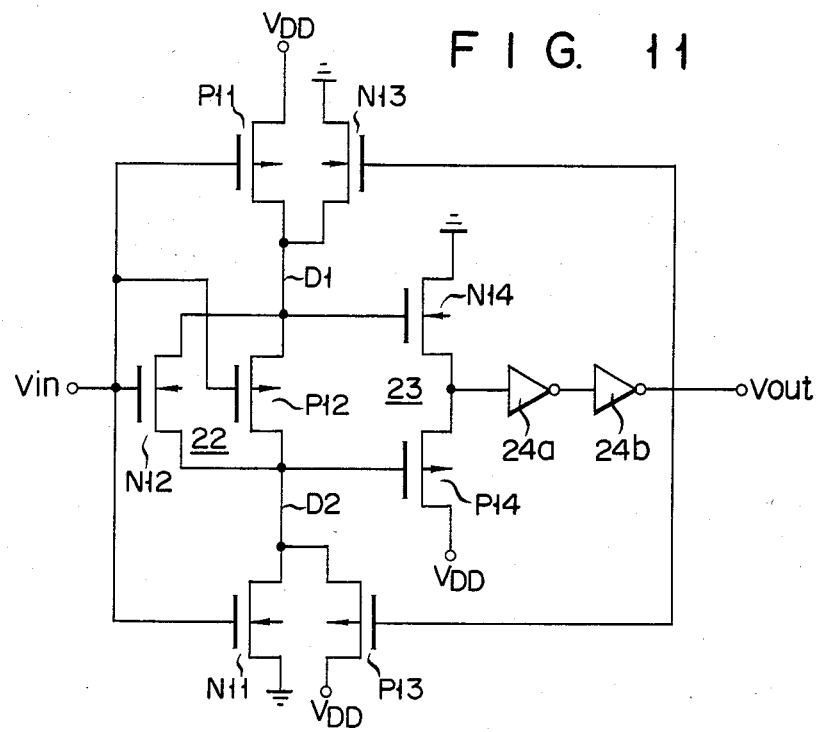

In the circuit of FIG. 11, two MOS inverters $24a$ and $24b$ are cascade-connected between the CMOS inverter 23 and complementary FETs $P_{13}$ and $N_{13}$ in the circuit shown in FIG. 10. The cascade connection of these two inverters $24a$ and $24b$ can provide a waveform-shaping effect, allowing the high-speed response of the Schmitt trigger circuit.

Figure 12:
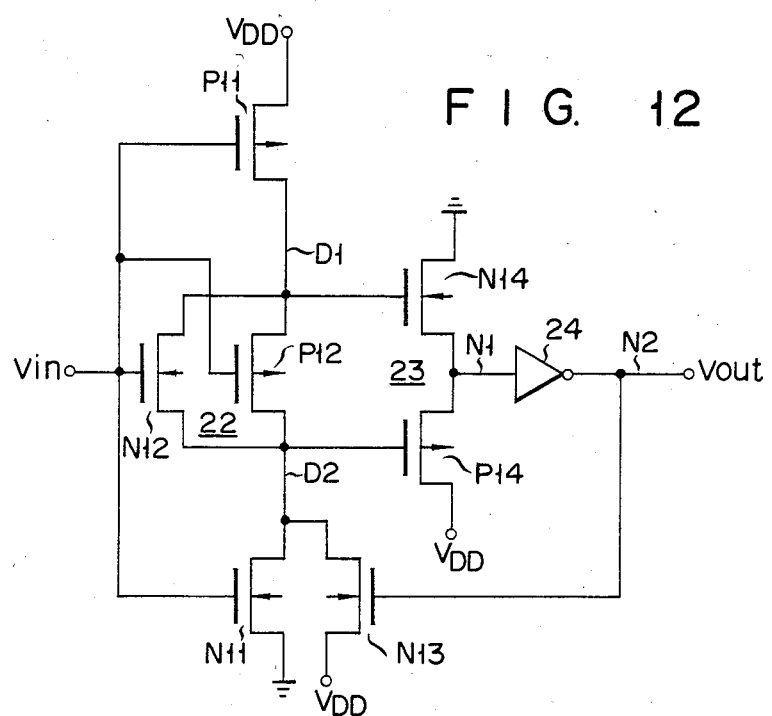

In the circuit of FIG. 12, a part of the feedback circuit (e.g., p-FET $P_{13}$) is omitted. In this case, the threshold voltage $V_{thH}$ of the Schmitt trigger circuit is the threshold voltage of the input CMOS inverter 22. On the other hand, in the case where n-FET $N_{13}$ is omitted, $V_{thL}$ corresponds to the threshold voltage of the CMOS inverter 21.

Figure 13:
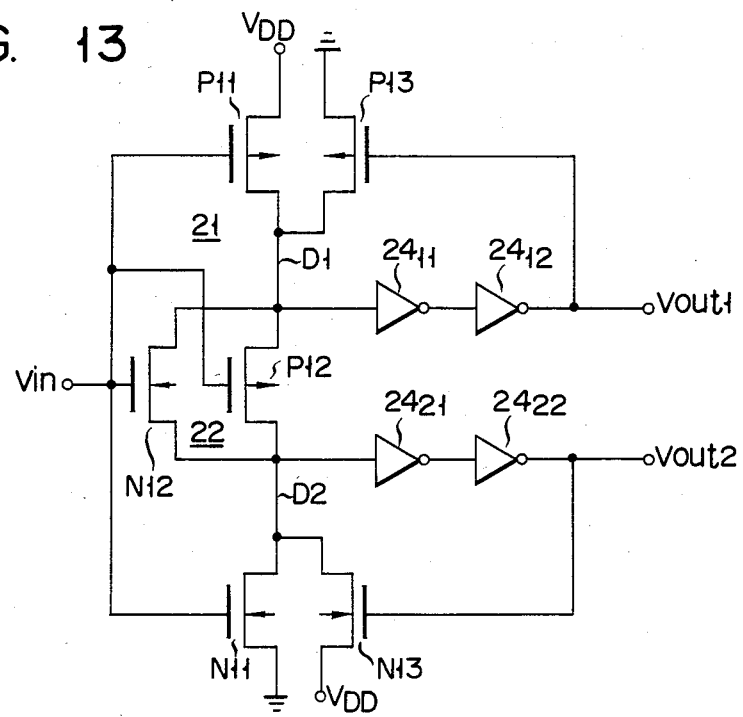

In the circuit shown in FIG. 13, the feedback voltages are separately applied to FETs $P_{13}$ and $N_{13}$. In other words, the feedback voltage is applied from the drains $D_1$ of FET $P_{11}$ through inverters $24_{11}$ and $24_{12}$ to p-FET $P_{13}$. The other feedback voltage is applied from the drain $D_2$ of FET $N_{11}$ through inverters $24_{21}$ and $24_{22}$ to n-FET $N_{13}$.

Figure 14:
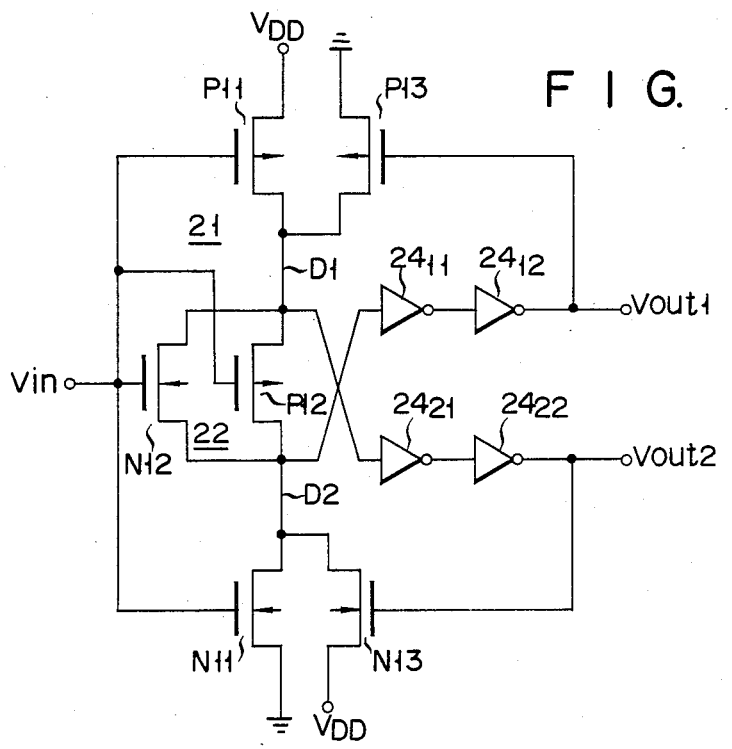

In the circuit of FIG. 14, the feedback voltage is applied from the drain $D_2$ of FET $N_{11}$ through inverters $24_{11}$ and $24_{12}$ to FET $P_{13}$. The feedback voltage is applied from the drain $D_1$ of FET $P_{11}$ through inverters $24_{21}$ and $24_{22}$ to FET $N_{13}$.

What is claimed is:

1. A Schmitt trigger circuit having lower and higher threshold voltages, comprising:
   first and second power supply terminals between which an operating voltage is applied;

first MOS inverter means including a complementary channel conductivity pair of first and second MOS transistors each having a drain, a source and a gate, said first and second MOS transistors having their gates connected together to receive an input voltage signal, and their sources connected to said first and second power supply terminals, respectively, and circuit means connected between the drains of said first and second MOS transistors for transmitting a potential variation at the drain of one of said first and second MOS transistors, which potential variation is caused by a voltage variation of said input voltage signal, to the drain of the other transistor after a delay;

second MOS inverter means responsive to said first MOS inverter means; and feedback circuit means responsive to said second MOS inverter for suppressing the potential variation at the drain of at least one of said first and second MOS transistors of said first MOS inverter means until said input voltage signal becomes lower than said lower threshold voltage or higher than said higher threshold voltage of said Schmitt trigger circuit; and output means coupled to said feedback circuit means for providing an output voltage signal of said Schmitt trigger circuit.

2. A Schmitt trigger circuit according to claim 1, wherein said second MOS inverter means comprises a complementary channel conductivity pair of third and fourth MOS transistors each having a drain, a source and a gate, and connected with the source-drain paths thereof in series between said first and second power supply terminals, the gates of said third and fourth MOS transistors being connected to the drains of said first and second MOS transistors, respectively.

3. A Schmitt trigger circuit according to claim 2, wherein said third and fourth MOS transistors are complementary to said first and second MOS transistors, respectively, and the sources of said third and fourth MOS transistors are connected to said second and first power supply terminals, respectively.

4. A Schmitt trigger circuit according to claim 2, wherein said third and fourth MOS transistors are complementary to said second and first MOS transistors, respectively, and the sources of said third and fourth MOS transistors are connected to said first and second power supply terminals, respectively.

5. A Schmitt trigger circuit according to claim 1, wherein said circuit means comprises a complementary channel conductivity pair of parallel-connected MOS transistors having their gates connected together to receive the input signal.

6. A Schmitt trigger circuit according to claim 1, wherein said circuit means comprises resistor means.

7. A Schmitt trigger circuit according to claim 1, wherein said feedback circuit means comprises third MOS inverter means connected to said second MOS inverter means, and a complementary channel conductivity pair of third and fourth MOS transistors each having a drain-source path and a gate, said third and fourth MOS transistors being complementary to said second and first MOS transistors, respectively, and having their gates connected together to an output of said third MOS inverter means, and their drain-source paths connected between the drain of said first MOS transistor and said second power supply terminal and between the drain of said second MOS transistor and first power supply terminal, respectively.

8. A Schmitt trigger circuit according to claim 1, wherein said feedback circuit means comprises a complementary pair of third and fourth MOS transistors each having a source-drain path and gate, said third and fourth MOS transistors being complementary to said first and second MOS transistors, respectively, and having their gates connected together to an output of said second MOS inverter means, and their drain-source paths connected between the drain of said first MOS transistor and said second power supply terminal and between the drain of said second MOS transistor and said first power supply terminal, respectively.

9. A Schmitt trigger circuit according to claim 8, wherein said feedback circuit means further comprises a cascade connection of an even number of inverters between the output of said second MOS inverter means and the gates of said third and fourth MOS transistors.

10. A Schmitt trigger circuit according to claim 1, wherein said second MOS inverter means comprises cascade connected inverter pairs each connected to a respective one of the drains of said first and second MOS transistors, and wherein said feedback circuit means is arranged to suppress the potential variations at the drains of said first and second MOS transistors in response to said pair of inverters.

11. A Schmitt trigger circuit according to claim 1, wherein said feedback circuit means comprises a third MOS inverter connected to said second MOS inverter means and a third MOS transistor having a source-drain path and a gate, said third MOS transistor having its source-drain path connected in series with the source-drain path of one of said first and second MOS transistors of the same channel type as said third MOS transistor between said first and second power supply terminals, and its gate connected to an output of said third MOS inverter.

12. A Schmitt trigger circuit comprising:

first and second power supply terminals between which an operating voltage is applied;

first MOS inverter means including a complementary channel conductivity pair of first and second MOS transistors each having a drain, a source and a gate, said first and second MOS transistors having their gates connected together to receive an input voltage signal, and their sources connected to said first and second power supply terminals, respectively, and a complementary channel conductivity pair of third and fourth MOS transistors each having a gate, a source, and a drain, said third and fourth MOS transistors having their source-drain paths connected in parallel between said drains of said first and second MOS transistors and their gates connected together to receive the input voltage signal;

second MOS inverter means having a complementary channel conductivity pair of fifth and sixth MOS transistors each having a drain, a source and a gate, said fifth and sixth MOS transistor having their drains connected together, their sources connected to said second and first power supply terminals respectfully, and their gates connected to the drains of said first and second MOS transistors, respectively;

third MOS inverter means having an input connected to said drains of said fifth and sixth MOS transistors; and a seventh MOS transistor have a source-drain path and a gate, said seventh MOS transistor having its source-drain path connected in series with one of said first and second MOS transistors of the same channel type between said first and second power supply terminals, and its gate connected to an output of said third MOS inverter means.

13. A Schmitt trigger circuit according to claim 12, further comprising an eighth MOS transistor having a source-drain path and gate, said eighth MOS transistor being complementary to said seventh MOS transistor, and having its source-drain path connected in series with the other of said first and second MOS transistors of the same channel type between said first and second power supply terminals, and its gate connected to the output of said third MOS inverter means.

14. A Schmitt trigger circuit according to claim 12, wherein said fifth and sixth MOS transistors are complementary to said first and second MOS transistors, respectively.

15. A Schmitt trigger circuit according to claim 12, wherein said fifth and sixth MOS transistors are complementary to said second and first MOS transistors, respectively.

16. A Schmitt trigger circuit comprising:
first and second power supply terminals between which an operating voltage is applied;
first MOS inverter means including a complementary channel conductivity pair of first and second MOS transistors each having a drain, a source and a gate, said first and second MOS transistors having their gates connected together to receive an input voltage signal, and their sources connected to said first and second power supply terminals, respectively, and a complementary channel conductivity pair of third and fourth MOS transistors having their source-drain paths connected in parallel between said drains of said first and second MOS transistors and their gates connected together to receive the input voltage signal;
second and third MOS inverter means having their inputs connected to the drains of said first and second MOS transistors, respectively;
fourth and fifth MOS inverter means having their inputs connected to outputs of said second and third MOS inverter means, respectively; and
a complementary channel conductivity pair of fifth and sixth MOS transistors each having a source-drain path and a gate, said fifth transistor having its source-drain path connected in series with one of said first and second MOS transistors of the same channel type between said first and second power supply terminals, and its gate connected to an output of one of said fifth and sixth MOS inverters, and said sixth transistor having its source-drain path connected in series with the other of said first and second MOS transistors of the same channel type between said first and second power supply terminals, and its gate connected to an output of the other of said fifth and sixth MOS inverters.

17. A Schmitt trigger circuit comprising:
first and second power supply terminals between which an operating voltage is applied;
first MOS inverter means including a complementary channel conductivity pair of first and second MOS transistor each having a drain, a source and a gate, said first and second MOS transistors having their gates connected together to receive an input voltage signal, and their sources connected to said first and second power supply terminals respectively, and a complementary channel conductivity pair of third and fourth MOS transistors having their source-drain paths connected in parallel between said drains of said first and second MOS transistors and their gates connected together to receive the input voltage signal;
second MOS inverter means having a complementary channel conductivity pair of fifth and sixth MOS transistors each having a drain, a source and a gate, said fifth and sixth MOS transistors being complementary to said first and second MOS transistors, respectively, and their drains being connected together, their sources connected to said second and first power supply terminals, respectively, and their gates connected to the drains of said first and second transistors, respectively; and
a complementary channel conductivity pair of seventh and eighth MOS transistors each having a source-drain path and a gate, said seventh and eighth MOS transistors having their gates connected to the drains of said fifth and sixth transistors, said seventh transistor having is source-drain path connected between said first and second power supply terminals in series with one of said first and second transistors which is complementary to said seventh transistor, and said eighth transistor having its source-drain path connected between said first and second power supply terminals in series with the other of said first and second transistors, which is complementary to said eighth transistor.

* * * * *